(12) United States Patent
Jiang et al.

(10) Patent No.: US 11,705,527 B2
(45) Date of Patent: Jul. 18, 2023

(54) SUBSTRATES HAVING A BROADBAND ANTIREFLECTION LAYER AND METHODS OF FORMING A BROADBAND ANTIREFLECTION LAYER

(71) Applicant: University of Florida Research Foundation, Inc., Gainesville, FL (US)

(72) Inventors: Peng Jiang, Gainesville, FL (US); Zhuxiao Gu, Gainesville, FL (US); Ruwen Tan, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 264 days.

(21) Appl. No.: 16/956,029

(22) PCT Filed: Dec. 18, 2018

(86) PCT No.: PCT/US2018/066234
§ 371 (c)(1),
(2) Date: Jun. 19, 2020

(87) PCT Pub. No.: WO2019/126171
PCT Pub. Date: Jun. 27, 2019

(65) Prior Publication Data
US 2021/0091241 A1   Mar. 25, 2021

Related U.S. Application Data

(60) Provisional application No. 62/608,858, filed on Dec. 21, 2017.

(51) Int. Cl.
*H01L 31/18* (2006.01)
*G02B 1/118* (2015.01)
*H01L 31/0216* (2014.01)

(52) U.S. Cl.
CPC ........ *H01L 31/02168* (2013.01); *G02B 1/118* (2013.01); *H01L 31/186* (2013.01)

(58) Field of Classification Search
CPC .. H01L 31/02168; H01L 31/186; G02B 1/118
See application file for complete search history.

(56) References Cited

U.S. PATENT DOCUMENTS

| 3,422,535 A | 1/1969 | Johnson |
| 3,671,105 A | 6/1972 | Williams et al. |
| (Continued) | | |

FOREIGN PATENT DOCUMENTS

| CN | 103935057 A | 7/2014 |
| CN | 105036068 A | 11/2015 |
| (Continued) | | |

OTHER PUBLICATIONS

Sliney, What is light? The visible spectrum and beyond, Eye (2016) 30, 222-229 (Year: 2016).*

(Continued)

*Primary Examiner* — Earl N Taylor
(74) *Attorney, Agent, or Firm* — Thomas|Horstemeyer, LLP

(57) ABSTRACT

Embodiments of the present disclosure provide for methods of making substrates having an (AR) antireflective layer, substrates having an antireflective layer, devices including a substrate having an antireflective layer, and the like. The AR layer can have a total specular reflection of less than 10% at a wavelength of about 400-800 nm, and a height of about 500-1000 nm.

10 Claims, 5 Drawing Sheets

(56) References Cited

U.S. PATENT DOCUMENTS

| | | | |
|---|---|---|---|
| 4,125,319 A | 11/1978 | Frank et al. | |
| 4,340,479 A | 7/1982 | Pall | |
| 4,664,748 A * | 5/1987 | Ueno | H01L 31/0543 430/323 |
| 4,781,441 A | 11/1988 | Kanbe et al. | |
| 4,810,633 A | 3/1989 | Bauer et al. | |
| 5,147,716 A | 9/1992 | Bellus | |
| 5,337,018 A | 8/1994 | Yamagishi | |
| 5,429,743 A | 7/1995 | Geus et al. | |
| 5,529,524 A | 6/1996 | Jones | |
| 5,641,332 A | 6/1997 | Faber et al. | |
| 5,753,014 A | 5/1998 | Van Rijn | |
| 5,939,189 A | 8/1999 | Phillips et al. | |
| 5,948,470 A | 9/1999 | Harrison et al. | |
| 5,993,661 A | 11/1999 | Ruckenstein et al. | |
| 6,044,981 A | 4/2000 | Chu et al. | |
| 6,531,304 B1 | 3/2003 | Boennemann et al. | |
| 6,565,763 B1 | 5/2003 | Asakawa et al. | |
| 6,649,255 B1 | 11/2003 | Fain et al. | |
| 6,881,582 B2 | 4/2005 | Ratogi et al. | |
| 6,929,764 B2 | 8/2005 | Jiang et al. | |
| 6,958,137 B2 | 10/2005 | Lee et al. | |
| 7,351,470 B2 | 4/2008 | Draheim et al. | |
| 7,630,589 B2 | 12/2009 | Kilic et al. | |
| 7,691,325 B2 | 4/2010 | Chopra et al. | |
| 7,889,954 B2 | 2/2011 | Sailor et al. | |
| 9,233,883 B1 | 1/2016 | Rauscher et al. | |
| 9,272,947 B2 | 3/2016 | Baca et al. | |
| 10,189,967 B2 | 1/2019 | Jiang et al. | |
| 10,700,225 B2 | 6/2020 | Wang et al. | |
| 2003/0031438 A1 | 2/2003 | Kambe et al. | |
| 2004/0131779 A1 | 7/2004 | Haubrich et al. | |
| 2004/0131799 A1 | 7/2004 | Arsenault et al. | |
| 2004/0184948 A1 | 9/2004 | Rakow et al. | |
| 2005/0147807 A1 | 7/2005 | Haas et al. | |
| 2006/0137462 A1 | 6/2006 | Divigalpitiya et al. | |
| 2007/0036653 A1 | 2/2007 | Bak et al. | |
| 2007/0156079 A1 | 7/2007 | Brown | |
| 2007/0206270 A1 | 9/2007 | Iwamatsu et al. | |
| 2008/0006574 A1 | 1/2008 | Ramaswamy et al. | |
| 2008/0027199 A1 | 1/2008 | Mazurek et al. | |
| 2008/0108142 A1 | 5/2008 | Hall et al. | |
| 2008/0185498 A1 | 8/2008 | Purdy et al. | |
| 2008/0233418 A1 | 9/2008 | Krueger | |
| 2008/0309923 A1 | 12/2008 | Falk | |
| 2009/0034051 A1 | 2/2009 | Arsenault et al. | |
| 2009/0274873 A1 * | 11/2009 | Shinotsuka | B82Y 40/00 427/372.2 |
| 2010/0051561 A1 | 3/2010 | Lee | |
| 2010/0058844 A1 | 3/2010 | Lin et al. | |
| 2010/0068168 A1 | 3/2010 | Song et al. | |
| 2010/0069726 A1 | 3/2010 | Levinson | |
| 2010/0125113 A1 | 5/2010 | Xiao et al. | |
| 2010/0150511 A1 | 6/2010 | Arsenault et al. | |
| 2010/0155325 A1 | 6/2010 | Zhang et al. | |
| 2010/0188732 A1 | 7/2010 | Akashi et al. | |
| 2010/0216310 A1 | 8/2010 | Metz et al. | |
| 2010/0218716 A1 | 9/2010 | Havens et al. | |
| 2010/0235107 A1 | 9/2010 | Fukumura et al. | |
| 2010/0244169 A1 | 9/2010 | Maeda et al. | |
| 2010/0315703 A1 | 12/2010 | Purdy et al. | |
| 2011/0019277 A1 | 1/2011 | Sager et al. | |
| 2011/0097814 A1 | 4/2011 | Bommarito et al. | |
| 2011/0111173 A1 * | 5/2011 | Ogawa | C23C 24/08 428/221 |
| 2011/0140106 A1 | 6/2011 | Forbes | |
| 2011/0194261 A1 | 8/2011 | Tanaka et al. | |
| 2011/0233476 A1 | 9/2011 | Arsenault | |
| 2011/0255035 A1 | 10/2011 | Wu | |
| 2012/0051489 A1 | 3/2012 | Varanasi et al. | |
| 2012/0073388 A1 | 3/2012 | Chibante | |
| 2012/0074612 A1 | 3/2012 | Scrivens et al. | |
| 2012/0152338 A1 | 6/2012 | Ha et al. | |
| 2012/0225517 A1 | 9/2012 | Zhang et al. | |
| 2012/0262789 A1 | 10/2012 | Xie et al. | |
| 2012/0281292 A1 | 11/2012 | Baca et al. | |
| 2012/0293802 A1 | 11/2012 | Ozin et al. | |
| 2012/0313205 A1 | 12/2012 | Haddad et al. | |
| 2012/0321810 A1 | 12/2012 | Tebby et al. | |
| 2013/0078750 A1 | 3/2013 | Yeo et al. | |
| 2013/0199995 A1 | 8/2013 | Jiang et al. | |
| 2013/0215513 A1 | 8/2013 | Liang et al. | |
| 2013/0222881 A1 | 8/2013 | Aizenberg et al. | |
| 2013/0258483 A1 | 10/2013 | Pett et al. | |
| 2013/0320467 A1 | 12/2013 | Buchanan et al. | |
| 2013/0340824 A1 * | 12/2013 | Oh | H01L 31/02168 136/256 |
| 2014/0017145 A1 | 1/2014 | Aizenberg et al. | |
| 2014/0106468 A1 | 4/2014 | Boersma | |
| 2014/0166100 A1 | 6/2014 | Watanabe et al. | |
| 2014/0319524 A1 * | 10/2014 | Phillips | H01L 31/02363 438/72 |
| 2015/0035269 A1 | 2/2015 | Hooper et al. | |
| 2015/0157453 A1 | 6/2015 | Nazirizadeh et al. | |
| 2015/0276989 A1 | 10/2015 | Han et al. | |
| 2016/0032141 A1 | 2/2016 | Maghsoodi et al. | |
| 2016/0254395 A1 | 9/2016 | Jiang et al. | |
| 2016/0326334 A1 | 11/2016 | Jiang et al. | |
| 2017/0209045 A1 | 7/2017 | Choo et al. | |
| 2017/0215790 A1 | 8/2017 | Levinson et al. | |
| 2017/0225395 A1 | 8/2017 | Boydston et al. | |
| 2017/0271259 A1 | 9/2017 | Hotta et al. | |
| 2021/0091241 A1 * | 3/2021 | Jiang | H01L 31/02168 |

FOREIGN PATENT DOCUMENTS

| | | |
|---|---|---|
| EP | 0341675 A2 | 11/1989 |
| EP | 2220520 A2 | 8/2010 |
| WO | 9820388 A1 | 5/1998 |
| WO | 2000010934 A1 | 3/2000 |
| WO | 02073699 A3 | 11/2002 |
| WO | 2007070486 A2 | 6/2007 |
| WO | 2008060322 A2 | 5/2008 |
| WO | 2010007853 A1 | 1/2010 |
| WO | 2015066337 A1 | 5/2015 |
| WO | 2018213570 A2 | 11/2018 |

OTHER PUBLICATIONS

International Search Report and Written Opinion for PCT/US2014/063163 dated Jun. 25, 2015.

International Search Report and Written Opinion issued in PCT/US2017/046886 dated Oct. 20, 2017.

International Search Report and Written Opinion dated Jun. 26, 2012 for PCT Patent Application No. PCT/US2011/057484.

International Search Report for International Application No. PCT/US2018/033173, dated Nov. 21, 2018.

International Search Report for International Application No. PCT/US2019/017862, dated Jan. 21, 2020.

International Search Report for PCT/US19/38193 dated Sep. 5, 2019.

International Search Report for PCT/US2018/066349 dated Mar. 15, 2019.

International Search Report for PCT/US2018/066353 dated Mar. 15, 2019.

Ionov, Leonid. "Soft microorigami: self-folding polymer films." Soft Matter 7.15 (2011): 6786-6791.

J. Aizenberg, P.V. Braun, P. Wiltzius, "Patterned Colloidal Deposition Controlled by Electrostatic and Capillary Forces", Phys. Rev. Lett. 84 (2000) 2997-3000.

Yue et al., "Lamellar Hydrogels with High Toughness and Ternary Tunable Photonic Stop-Band", Advanced Materials 2013, 25: 3106-3110.

J. Tien, A. Terfort, G.M. Whitesides, "Microfabrication through Electrostatic Self-Assembly", Langmuir 13 (1997) 5349-5355.

J.-H. Kim, S. Fujita, S. Shiratori, "Design of a thin film for optical applications, consisting of high and low refractive index multilayers, fabricated by a layer-by-layer self-assembly method", Colloid Surf. Aspects 284-285 (2006) 290-294.

(56) References Cited

OTHER PUBLICATIONS

J.A. Hiller, J.D. Mendelsohn, M.F. Rubner, "Reversibly erasable nanoporous anti-reflection coatings from polyelectrolyte multilayers", Nat. Mater. 1 (2002) 59-63.
J.Q. Xi, M.F. Schubert, J.K. Kim, E.F. Schubert, M. Chen, S.-Y. Lin, LiuW, J.A. Smart, "Optical thin-film materials with low refractive index for broadband elimination of Fresnel reflection", Nat. Photon. 1 (2007) 176-179.
Jang et al., "Combining Pattern Instability and Shape-Memory Hysteresis for Phononic Switching", Nano Lett. 2009, 9, 5: 2113-2119.
Yunus, S.; et al. Diffusion of Oligomers from Polydimethylsiloxane Stamps in Microcontact Printing: Surface Analysis and Possible Application Surf. Interface Anal. 2007, 39, 922-925.
Jiang et al., Template-Directed Preparation of Macroporous Polymers with Oriented and Crystalline Arrays of Voids, Journal of the American Chemical Society 1999, 121(50): 11630-11637.
Jiang, P.; et al. Single-Crystal Colloidal Multilayers of Controlled Thickness. Chem. Mater. 1999, 11, 2132-2140.
Joannopoulos, J. D.; et al. Photonic Crystals: Molding the Flow of Light. Princeton University Press: Princeton, 1995.
K. Askar, B.M. Phillips, X. Dou, J. Lopez, C. Smith, B. Jiang, P. Jiang, "Self-assembled nanoparticle antiglare coatings", Opt. Lett. 37 (2012) 4380-4382.
K.M. Yeung, W.C. Luk, K.C. Tam, C.Y. Kwong, M.A. Tsai, H.C. Kuo, A.M.C. Ng, A.B. Djurisic, "2-Step self-assembly method to fabricate broadband omnidirectional antireflection coating in large scale", Sol Energ Mater Sol C 95 (2011) 699-703.
Kang et al., "Broad-wavelength-range chemically tunable block-copolymer photonic gels", Nature Materials 2007, 6: 957-960.
Karrock, Torben; et al. "Pressure sensor based on flexible photonic crystal membrane." Biomedical optics express 6.12 (2015): 4901-4911.
Keller, K.; et al. Inkjet Printing of Multicolor Daylight Visible Opal Holography. Adv. Funct. Mater. 2018, 28, 1706903.
Kloxin et al., "Covalent adaptable networks: smart, reconfigurable and responsive network systems", Chem. Soc. Rev. 2013, 42: 7161-7173.
Kluhr et al., Partially Oxidized Macroporous Silicon: A Three-Dimensional Photonic Matrix for Microarray Applications, Advanced Materials 2006, 18(23): 3135-3139.
Kobatake; et al. "Rapid and reversible shape changes of molecular crystals on photoirradiation" vol. 446, Apr. 12, 2007, doi: 10.1038/nature05669, pp. 1-4.
Koerner et al., "Remotely actuated polymer nanocomposites—stress-recovery of carbon-nanotube-filled thermoplastic elastomers", nature materials 2004, 3: 115-120.
Kukiattrakoon, Boonlert; et al. "Chemical durability and microhardness of dental ceramics immersed in acidic agents." Acta Odontologica Scandinavica 68.1 (2010): 1-10.
Kukiattrakoon, Boonlert; et al. "Degradability of fluorapatite-leucite ceramics in naturally acidic agents." Dental materials journal (2010): 1008310070-1008310070.
Kukiattrakoon, Boonlert; et al. "Effect of acidic agents on surface roughness of dental ceramics." Dental research journal 8.1 (2011): 6.
Kukiattrakoon, Boonlert; et al. "The effect of acidic agents on surface ion leaching and surface characteristics of dental porcelains." The journal of prosthetic dentistry 103.3 (2010): 148-162.
Kukiattrakoon, Boonlert; et al. "Vicker's microhardness and energy dispersive x-ray analysis of fluorapatite-leucite and fluorapatite ceramics cyclically immersed in acidic agents." Journal of oral science 51.3 (2009): 443-450.
Kunzelman et al., "Shape memory polymers with built-in threshold temperature sensors", Journal of Materials Chemistry 2008, 18: 1082-1086.
Kuswandi; et al., "A Simple Visual Ethanol Biosensor Based on Alcohol Oxidase Immobilized onto Polyaniline Film for Halal Verification of Fermented Beverage Samples", Feb. 2014, Sensors, 14(2):2135-2149 (Year: 2014).
Kuznetsov, A. I.; et al. Optically Resonant Dielectric Nanostructures. Science 2016, 354, 2472.
L. Ionov, "3D Microfabrication using Stimuli-Responsive Self-Folding Polymer Films", Polymer Reviews, 2013, 53: 92-107.
Lee, E.; et al. Bio-Inspired Responsive Polymer Pillar Arrays. MRS Commun. 2015, 5, 97-114.
Lee, H. S.; et al. Colloidal Photonic Crystals toward Structural Color Palettes for Security Materials. Chem. Mater. 2013, 25, 2684-2690.
Lee, J. N.; et al. Solvent Compatibility of Poly(Dimethylsiloxane)-Based Microfluidic Devices. Anal. Chem. 2003, 75, 3544-6554.
Lendlein et al., "Biodegradable, Elastic Shape-Memory Polymers for Potential Biomedical Applications", Science 2002, vol. 296: 1673-1676.
Yue et al., "Mechano-actuated ultrafast full-colour switching in layered photonic hydrogels", nature communications 2014: 1-8.
Lendlein, A.; et al. Shape-Memory Polymers. Angew. Chem. Int. Ed. 2002, 41, 2034-2057.
Leng et al., "Shape-Memory Polymers—A Class of Novel Smart Materials", MRS Bulletin 2009, 34: 848-855, vww.mrs.org/bulletin.
Leng et al., "Synergic effect of carbon black and short carbon fiber on shape memory polymer actuation by electricity", Journal of Applied Physics 2008, 104: 1-4.
Leo, S. Y.; et al. Chromogenic Photonic Crystal Sensors Enabled by Multistimuli-Responsive Shape Memory Polymers Small 2018, 14, 1703515.
Li, H. L.; et al. Superoleophilic and Superhydrophobic Inverse Opals for Oil Sensors. Adv. Funct. Mater. 2008, 18, 3258-3264.
Li, P.; et al. Novel Programmable Shape Memory Polystyrene Film: A Thermally Induced Beam-Powered Splitter. Sci. Rep. 2017, 7, 44333.
Li, Y., et al. "Broadband near-infrared antireflection coatings fabricated by three-dimensional direct laser writing." Optics letters 43.2 (2018): 239-242.
Cai, Z. Y.; et al. A Photonic Crystal Protein Hydrogel Sensor for Candida Albicans. Angew. Chem. Int. Ed. 2015, 54, 13036-13040.
Velev, O. D.; et al. Materials Fabricated by Micro- and Nanoparticle Assembly—the Challenging Path from Science to Engineering. Adv. Mater. 2009, 21, 1897-1905.
A. Deak, B. Bancsi, A.L. Toth, A.L. Kovacs, Z. Horvolgyi, "Complex Langmuir-Blodgett films from silica nanoparticles: An optical spectroscopy study", Colloid Surf. A 278 (2006) 10-16.
A. Deak, I. Szekely, E. Kalman, Z. Keresztes, A.L. Kovacs, Z. Horvolgyi, "Nanostructured silica Langmuir-Blodgett films with antireflective properties prepared on glass substrates", Thin Solid Films 484 (2005) 310-317.
A. Gombert, B. Blasi, C. Buhler, P. Nitz, J. Mick, W. Hossfeld, M. Niggemann, "Some application cases and related manufacturing techniques for optically functional microstructures on large areas", Opt. Eng. 43 (2004) 2525-2533.
A. Gombert, W. Glaubitt, K. Rose, J. Dreibholz, B. Blasi, A. Heinzel, D. Sporn, W. Doll, V. Wittwer, "Subwavelength-structured antireflective surfaces on glass", Thin Solid Films 351 (1999) 73-78.
Zhong, K.; et al. Instantaneous, Simple, and Reversible Revealing of Invisible Patterns Encrypted in Robust Hollow Sphere Colloidal Photonic Crystals. Adv. Mater. 2018, 30, 1707246.
Zhao, Y.; et al. Bio-Inspired Variable Structural Color Materials. Chem. Soc. Rev. 2012, 41, 3297-3317.
Aguirre, C. I.; et al. Tunable Colors in Opals and Inverse Opal Photonic Crystals. Adv. Funct. Mater. 2010, 20, 2565-2578.
Aksoy, Gökhan, et al. "Effect of various treatment and glazing (coating) techniques on the roughness and wettability of ceramic dental restorative surfaces." Colloids and surfaces B: Biointerfaces 53.2 (2006): 254-259.
Al-Marzok, Maan; et al. "The effect of the surface roughness of porcelain on the adhesion of oral *Streptococcus nutans*." J Contemp Dent Pract 10.6 (2009): E017-24.
Arsenault et al., "From colour fingerprinting to the control of photoluminescence in elastic photonic crystals", nature materials 2006, 5: 179-184.
Asher et al., "Photonic Crystal Carbohydrate Sensors: Low Ionic Strength Sugar Sensing", J. Am. Chem. Soc. 2003, 125: 3322-3329.

(56) References Cited

OTHER PUBLICATIONS

B.-T. Liu, Y.-T. Teng, R.-H. Lee, W.-C. Liaw, C.-H. Hsieh, "Strength of the interactions between light-scattering particles and resins affects the haze of anti-glare films", Colloid Surf. A 389 (2011) 138-143.
B.E. Yoldas, D.P. Partlow, "Formation of Broad Band Antireflective Coatings on Fused Silica for High Power Laser Applications", Thin Solid Films 129 (1985) 1-14.
B.G. Prevo, E.W. Hon, O.D. Velev, "Assembly and characterization of colloid-based antireflective coatings on multicrystalline silicon solar cells", J. Mater. Chem. 17 (2007) 791-799.
B.G. Prevo, O.D. Velev, "Controlled, Rapid Deposition of Structured Coatings from Micro-and Nanoparticle Suspensions", Langmuir 20 (2004) 2099-2107.
B.T. Liu, W.D. Yeh, "Antireflective surface fabricated from colloidal silica nanoparticles", Colloid Surf. A 356 (2010) 145-149.
B.T. Liu, W.D. Yeh, "Reflective properties of nanoparticle-arrayed surfaces", Thin Solid Films 518 (2010) 6015-6021.
B.T. Liu; et al. "A novel method to control inner and outer haze of an anti-glare film by surface modification of light-scattering particles", J. Colloid Interf. Sci. 350 (2010) 421-426.
Bartlett, D. W., et al. "The association of tooth wear, diet and dietary habits in adults aged 18-30 years old." Journal of dentistry 39.12 (2011): 811-816.
Behl et al., "Multifunctional Shape-Memory Polymers", Adv. Mater. 2010, 22: 3388-3410.
Bertone et al., "Thickness Dependence of the Optical Properties of Ordered Silica-Air and Air-Polymer Photonic Crystals", Physical Review Letters 1999, 83, 2: 300-303.
Boyle, B. M.; et al. Structural Color for Additive Manufacturing: 3d-Printed Photonic Crystals from Block Copolymers. ACS Nano 2017, 11, 3052-3058.
Burgess et al., "Structural colour in colourimetric sensors and indicators", Journal of Materials Chemistry C 2013, 1: 6075-6086.
Burgess, I. B.; et al. Encoding Complex Wettability Patterns in Chemically Functionalized 3d Photonic Crystals. J. Am. Chem. Soc. 2011, 133, 12430-12432.
Butler, Craig J., et al. "Effect of fluoride and 10% carbamide peroxide on the surface roughness of low-fusing and ultra low-fusing porcelain." The Journal of prosthetic dentistry 92.2 (2004): 179-183.
C. Heine, R.H. Morf, "Submicrometer gratings for solar energy applications", Appl. Opt. 34 (1995) 2476-2482.
C. Yakacki, "Shape-Memory and Shape-Changing Polymers", Polymer Reviews, 2013, 53: 1-5.
C.M. Kennemore Iii, U.J. Gibson, "Ion beam processing for coating MgF2 onto ambient temperature substrates", Appl. Opt. 23 (1984) 3608-3611.
C.S. Thompson, R.A. Fleming, M. Zou, "Solar Energy Materials & Solar Cells", Sol Energ Mater Sol C 115 (2013) 108-113.
Cansizoglu, H; et al. "Optical absorption properties of semiconducting nanostructures with different shapes" Advanced Optical Materials 2013, 1, 156-166. (Year: 2013).
Cao, Z; et al. "Study on the impact of silicon doping level on the trench profile using metal-assisted chemical etching" 2016, vol. 12, 742-746.
Ccahuana, Vanessa ZS, et al. "Surface degradation of glass ceramics after exposure to acidulated phosphate fluoride." Journal of Applied Oral Science 18.2 (2010): 155-165.
Chan et al., "Mechanochromic Photonic Gels", Advanced Materials 2013, 25: 3934-3947.
Chen; et al. "Directed water shedding on high-aspect-ratio shape memory polymer micropillar arrays" Advanced Materials, 2014, pp. 1283-1288, vol. 26, doi: 10.1002/adma.201304030.
Cho, Y.; et al. Elastoplastic Inverse Opals as Power-Free Mechanochromic Sensors for Force Recording. Adv. Funct. Mater. 2015, 25, 6041-6049.
Creugers, Nico HJ; et al. "A meta-analysis of durability data on conventional fixed bridges." Community Dentistry and Oral Epidemiology 22.6 (1994): 448-452.
Cui et al., "Inverse Opal Spheres Based on Polyionic Liquids as Functional Microspheres with Tunable Optical Properties and Molecular Recognition Capabilities", Angew. Chem. Int. Ed. 2014, 53: 3844-3848.
D. Chen, "Anti-reflection (AR) coatings made by sol-gel processes: A review", Sol. Energ. Mater. Sol. C. 68 (2001) 313-336.
D. Lee, M.F. Rubner, R.E. Cohen, "All-Nanoparticle Thin-Film Coatings", Nano Lett. 6 (2006) 2305-2312.
D. Lee, Z. Gemici, M.F. Rubner, R.E. Cohen, "Multilayers of Oppositely Charged SiO2 Nanoparticles: Effect of Surface Charge on Multi9layer Assembly", Langmuir 23 (2007) 8833-8837.
D.G. Stavenga; et al. "Light on the moth-eye corneal nipple array of butterflies", Proc. R. Soc. B 273 (2006) 661-667.
Dangla, R.; et al. Microchannel Deformations Due to Solvent-Induced Pdms Swelling. Lab Chip 2010, 10, 2972-2978.
Ding et al., "Morphology and Water Vapor Permeability of Temperature-Sensitive Polyurethanes", Journal of Applied Polymer Science, (2008) vol. 107: 4061-4069.
Ding, T.; et al. Revealing Invisible Photonic Inscriptions: Images from Strain. ACS Appl. Mater. Interfaces 2015, 7, 13497-13502.
Drummond, J. L., D; et al. "Physiological aging of an all-ceramic restorative material." Dental Materials 7.2 (1991): 133-137.
Du et al., "Solvent induced shape recovery of shape memory polymer based on chemically cross-linked poly(vinyl alcohol)", Soft Matter, 2010, 6: 3370-3376.
E. Metwalli, D.; et al. "Surface characterizations of mono-, di-, and tri-, aminosilane treated glass substrates", J. Colloid Interf. Sci. 298 (2006) 825-831.
Esquivel-Upshaw, J. F., et al. "Surface degradation of dental ceramics as a function of environmental pH." Journal of dental research 92.5 (2013): 467-471.
"Light," Wikipedia, https://en.wikipedia.orgiwiindex.php?title=Light &oldid=797818857 (accessed Feb. 22, 2019).
"Using Polyimide Tape to Mask Against Reactive-ion Etching," Tech Briefs, 2002 (accessed Feb. 21, 2019).
International Search Report for International Application PCT/US2018/066234, dated Mar. 25, 2019.
Esquivel-Upshaw, Josephine F., et al. "In Vivo Wear of Enamel by a Lithia Disilicate-Based Core Ceramic Used for Posterior Fixed Partial Dentures: First-Year Results." International Journal of Prosthodontics 19.4 (2006).
Esquivel-Upshaw, Josephine F., et al. "Resistance to staining, flexural strength, and chemical solubility of core porcelains for all-ceramic crowns." International Journal of Prosthodontics 14.3 (2001).
Esquivel-Upshaw, Josephine, et al. "Randomized, controlled clinical trial of bilayer ceramic and metal-ceramic crown performance." Journal of Prosthodontics: Implant, Esthetic and Reconstructive Dentistry 22.3 (2013): 166-173.
Zhao, Q.; et al. Shape Memory Polymer Network with Thermally Distinct Elasticity and Plasticity. Sci. Adv. 2016, 2, e1501297.
Fang, Y.; et al. Chromogenic Photonic Crystals Enabled by Novel Vapor-Responsive Shape Memory Polymers. Adv. Mater. 2015, 27, 3696-3704.
Fang, Y.; et al. Reconfigurable Photonic Crystals Enabled by Multistimuli-Responsive Shape Memory Polymers Possessing Room Temperature Shape Processability. ACS Appl. Mater. Interfaces 2017, 9, 5457-5467.
Felton et al., Soft Matter "Self-folding with shape memory composites", Soft Matter, 2013, 9, 7688-7694.
Fenzl et al., "Photonic Crystals for Chemical Sensing and Biosensing", Angewandte Chemie Ed. 2015, 53: 3318-3335.
Fischer, H.; et al. "Effect of surface roughness on flexural strength of veneer ceramics." Journal of Dental Research 82.12 (2003): 972-975.
Flannery, Anthony F., et al. "PECVD silicon carbide as a chemically resistant material for micromachined transducers." Sensors and Actuators A: Physical 70.1-2 (1998): 48-55.
Fu, Q. Q.; et al. Hierarchically Structured Photonic Crystals for Integrated Chemical Separation and Colorimetric Detection Nanoscale 2017, 9, 2457-2463.
Fudouzi et al., "Colloidal Crystals with Tunable Colors and Their Use as Photonic Papers", Langmuir 2003, 19: 9653-9660.

(56) References Cited

OTHER PUBLICATIONS

G. Zhou, J. He, J. "Antireflective coatings on Fresnel lenses by spin-coating of solid silica nanoparticles", Nanosci. Nanotechnol. 13 (2013) Abstract.

G.M. Nogueira, D. Banerjee, R.E. Cohen, M.F. Rubner, "Spray-Layer-by-Layer Assembly Can More Rapidly Produce Optical-Quality Multistack Heterostructures", Langmuir 27 (2011) 7860-7867.

Ge et al., "Highly Tunable Superparamagnetic Colloidal Photonic Crystals", Angew. Chem. Int. Ed. 2007, 46: 7428-7431.

Ge et al., "Rewritable Photonic Paper with Hygroscopic Salt Solution as Ink", Advanced Materials 2009, 21:4259-4264.

Ge, J. P.; et al. Responsive Photonic Crystals. Angew. Chem. Int. Ed. 2011, 50, 1492-1522.

Gemici et al., "Targeted Functionalization of Nanoparticle Thin Films via Capillary Condensation", Nano Letters 2009, 9, 3: 1064-1070.

Gourevich, I.; et al. Nanostructured Material for Optical Data Storage and Security Labeling. Chem. Mater. 2004, 16, 1471-1479.

Gourevich, Ilya, et al. "Multidye nanostructured material for optical data storage and security labeling." Chemistry of materials 16.8 (2004): 1472-1479.

Zhao, Q.; et al. Recent Progress in Shape Memory Polymer: New Behavior, Enabling Materials, and Mechanistic Understanding. Prog. Polym. Sci. 2015, 49-50, 79-120.

Grigoras et al., Fabrication of porous membrane filter from p-type silicon, Physica Status Solidi (a) 202(8): 1624-1628.

Gu et al., "Water-triggered shape memory of multiblock thermoplastic polyurethanes (TPUs)", RSC Adv. 2013, 3: 15783-15791.

Gugliuzza et al., "A review on membrane engineering for innovation in wearable fabrics and protective textiles", Journal of Membrane Science 446(2013): 350-375.

H. Fudouzi, M. Kobayashi, N. Shinya, "Assembly of Microsized Colloidal Particles on Electrostatic Regions Patterned through Ion Beam Irradiation", Langmuir 18 (2002) 7648-7652.

H. Jiang, K. Yu, Y.C. Wang, "Antireflective structures via spin casting of polymer latex", Opt. Lett. 32 (2007) 575-577.

H. Nagel, A. Metz, R. Hezel, "Porous SiO2 films prepared by remote plasma-enhanced chemical vapour deposition—a novel antireflection coating technology for photovoltaic modules", Sol. Energ. Mater. Sol. C. 65 (2001) 71-77.

H. Shimomura, Z. Gemici, R.E. Cohen, M.F. Rubner, "Layer-by-Layer-Assembled High-Performance Broadband Antireflection Coatings", ACS Appl. Mater. Interface 2 (2010) 813-820.

Zhang, Haixia, et al. "Application of PECVD SiC in glass micromachining." Journal of Micromechanics and Microengineering 17.4 (2007): 775.

H.Y. Koo, D.K. Yi, S.J. Yoo, D.Y. Kim, "A Snowman-like Array of Colloidal Dimers for Antireflecting Surfaces**", Adv. Mater. 16 (2004) 274-277.

Habault et al., "Light-triggered self-healing and shape-memory polymers", Chem. Soc. Rev. 2013, 42: 7244-7256.

Han et al., "Full Color Tunable Photonic Crystal from Crystalline Colloidal Arrays with an Engineered Photonic Stop-Band", Adv. Mater. 2012, 24,: 6438-6444.

Han, H; et al. "Metal-assisted chemical etching of silicon and nanotechnology applications" ScienceDirect 2014, 9, 271-304.

Zhang et al., Fabrication and bioseparation studies of adsorptive membranes/felts made from electrospun cellulose acetate nanofibers, Journal of Membrane Science 2008, 319(1-2): 176-184.

Zhang, G. G.; et al. Unusual Aspects of Supramolecular Networks: Plasticity to Elasticity, Ultrasoft Shape Memory, and Dynamic Mechanical Properties. Adv. Funct. Mater. 2016, 26, 931-937.

Hatton et al., "Assembly of large-area, highly ordered, crack-free inverse opal films", PNAS 2010, vol. 107, 23: 10354-10359.

Heintze, Siegward D; et al. "Survival of zirconia-and metal-supported fixed dental prostheses: a systematic review." International Journal of Prosthodontics 23.6 (2010).

Heo, Y.; et al. Controlled Insertion of Planar Defect in Inverse Opals for Anticounterfeiting Applications. ACS Appl. Mater. Interfaces 2017, 9, 43098-43104.

Heo, Y.; et al. Lithographically Encrypted Inverse Opals for Anti-Counterfeiting Applications. Small 2016, 12, 3819-3826.

Herrmann, M. "Corrosion of silicon nitride materials in aqueous solutions." Journal of the American Ceramic Society 96.10 (2013): 3009-3022.

Herrmann, M., et al. "Corrosion of silicon nitride materials in acidic and basic solutions and under hydrothermal conditions." Journal of the European Ceramic Society 23.4 (2003): 585-594.

Heuwers et al., "Shape-Memory Natural Rubber: An Exceptional Material for Strain and Energy Storage", Macromolecular Chemistry and Physics 2013, 214: 912-923.

Heuwers et al., "Stress-Induced Stabilization of Crystals in Shape Memory Natural Rubber", Macromolecular Rapid Communications 2013, 34: 180-184.

Holtz et al., "Polymerized colloidal crystal hydrogel films as intelligent chemical sensing materials", Nature 1997, 389: 829-832.

Hou, J.; et al. Four-Dimensional Screening Anti-Counterfeiting Pattern by Inkjet Printed Photonic Crystals. Chem.—An Asian J. 2016, 11, 2680-2685.

Hu, H. B.; et al. Magnetically Responsive Photonic Watermarks on Banknotes. J. Mater. Chem. C 2014, 2, 3695-3702.

Hu, H.; et al. Photonic Anti-Counterfeiting Using Structural Colors Derived from Magnetic-Responsive Photonic Crystals with Double Photonic Bandgap Heterostructures. J. Mater. Chem. 2012, 22, 11048-11053.

Huang et al., "Water-driven programmable polyurethane shape memory polymer: Demonstration and mechanism", Applied Physics Letters 2005, 86: 1-3.

Huang, Z; et al. "Metal-Assisted chemical etching of silicon: a review" Advanced Materials 2011, 23, 285-308.

International Preliminary Report on Patentability dated May 10, 2013 for PCT Patent Application No. PCT/US2011/057484.

S. Walheim, E. Schäffer, J. Mlynek, U. Steiner, "Nanophase-Separated Polymer Films as High-Performance Antireflection Coatings", Science 283 (1999) 520-522.

S.P. Pack, N.K. Kamisetty, M. Nonogawa, K.C. Devarayapalli, K. Ohtani, K. Yamada, Y. Yoshida, T. Kodaki, K. Makino, "Direct immobilization of DNA oligomers onto the amine-functionalized glass surface for DNA microarray fabrication through the activation-free reaction ofoxanine", Nucleic Acids Res. 35 (2007), 10 pages.

Sailer, Irena, et al. "A systematic review of the survival and complication rates of all-ceramic and metal-ceramic reconstructions after an observation period of at least 3 years. Part II: fixed dental prostheses." Clinical oral implants research 18 (2007): 86-96.

Salido, María P., et al. "Prospective clinical study of zirconia-based posterior four-unit fixed dental prostheses: four-year follow-up." International Journal of Prosthodontics 25.4 (2012).

Schäfer et al., "Fully Reversible Shape Transition of Soft Spheres in Elastomeric Polymer Opal Films", Langmuir 2013, 29: 11275-11283.

Schäfer et al., "Reversible Light-, Thermo-, and Mechano-Responsive Elastomeric Polymer Opal Films", Chemistry of Materials 2013, 25: 2309-2318.

Schauer, S.; et al. Tunable Diffractive Optical Elements Based on Shape-Memory Polymers Fabricated via Hot Embossing. ACS Appl. Mater. Interfaces 2016, 8, 9423-9430.

Schneider, Friedrich. "The financial flows of transnational crime and tax fraud in OECD countries: What do we (not) know?." Public Finance Review 41.5 (2013): 677-707.

Scurria, Mark S.; et al. "Meta-analysis of fixed partial denture survival: prostheses and abutments." The Journal of prosthetic dentistry 79.4 (1998): 459-464.

Shang, S. L.; et al. Fabrication of Magnetic Field Induced Structural Colored Films with Tunable Colors and Its Application on Security Materials. J. Colloid Interface Sci. 2017, 485, 18-24.

Small IV, et al., "Laser-activated shape memory polymer intravascular thrombectomy device", Optics Express 2005, 13: 8204-8213.

Stöber, W.; et al. Controlled Growth of Monodisperse Silica Spheres in Micron Size Range. J. Colloid Interface Sci. 1968, 26, 62-69.

(56) References Cited

OTHER PUBLICATIONS

Stojilovic, N., Why Can't We See Hydrogen in X-Ray Photoelectron Spectroscopy? J. Chem. Edu. 2012, 89, 1331-1332.
Stuart et al., "Emerging applications of stimuli-responsive polymer materials", Nature Materials 2010, 9: 101-113.
Sun; et al. "Broadband moth-eye antireflection coatings on silicon" Applied Physics Letters; Feb. 14, 2008, vol. 92, pp. 061112 (1)-(3).
T. Lohmueller, M. Helgert, M. Sundermann, R. Brunner, J.P. Spatz, "Biomimetic Interfaces for High-Performance Optics in the Deep-UV Light Range", Nano Lett. 8 (2008) 1429-1433.
T. Xie, "Recent advances in polymer shape memory", Polymer 2011, 52: 4985-5000.
Takeoka et al., "Polymer Gels that Memorize Structures of Mesoscopically Sized Templates. Dynamic and Optical Nature of Periodic Ordered Mesoporous Chemical Gels", Langmuir 2002, 18: 5977-5980.
Tobushi et al., "Thermomechanical properties in a thin film of shape memory polymer of polyurethane series", Smart Mater. Struct. (1996) 5: 483-491.
Toor, F; et al. "Nanostructured silicon via metal assisted catalyzed etch (MACE): chemistry fundamentals and pattern engineering" Nanotechnology 2016, 27, 412003.
Tsai et al., "Retainment of pore connectivity in membranes prepared with vapor-induced phase separation", Journal of Membrane Science 2010, 362: 360-373.
U. Schulz, "Review of modern techniques to generate antireflective propoerties on thermoplastic polymers", Appl. Opt. 45 (2006) 1608-1618.
Ye et al., "Invisible Photonic Prints Shown by Deformation", Advanced Functional Materials 2014, 24: 6430-6438.
Yang, D. P.; et al. Polymerization-Induced Colloidal Assembly and Photonic Crystal Multilayer for Coding and Decoding. Adv. Funct. Mater. 2014, 24, 817-825.
Velev et al., "Porous silica via colloidal crystallization", Nature 1997, 389: 447-448.
Vlasov, Y. A.; et al. On-Chip Natural Assembly of Silicon Photonic Bandgap Crystals. Nature 2001, 414, 289-293.
W.L. Min, B. Jiang, P. Jiang, "Bioinspired Self-Cleaning Antireflection Coatings", Adv. Mater. 20 (2008) 3914-3918.
Wang, M. S.; et al. Magnetically Responsive Nanostructures with Tunable Optical Properties. J. Am. Chem. Soc. 2016, 138, 6315-6323.
Wang, Zhen, et al. "Programmable, pattern-memorizing polymer surface." Advanced Materials 23.32 (2011): 3669-3673.
Weissman et al., "Thermally Switchable Periodicities and Diffraction from Mesoscopically Ordered Materials", Science 1996, 274: 959-960.
Witt, Kendhl Kate. "Optical Sensors for the Analysis of Alcohols in Fuels." (2016).
Woo et al., Preparation and characterization of three dimensionally ordered macroporous Li4Ti5O12 anode for lithium batteries, Electrochimica Acta 2007, 53(1): 79-82.
Yang et al., "Macroporous photonic crystal-based vapor detectors created by doctor blade coating", Appl. Phys. Lett. 2011, 98: 1-3.
Wu, S. L.; et al. Structural Color Patterns on Paper Fabricated by Inkjet Printer and Their Application in Anticounterfeiting. J. Phys. Chem. Lett. 2017, 8, 2835-2841.
X. Li, O. Niitsoo, A. Couzis, "Electrostatically driven adsorption of silica nanoparticles on functionalized surfaces", J. Colloid Interf. Sci. 394 (2013) 26-35.
X. Li, O. Niitsoo, A. Couzis, "Experimental studies on irreversibility of electrostatic adsorption of silica nanoparticles at solid-liquid interface", J. Colloid Interf. Sci. 420 (2014) 50-56.
X.T. Zhang, O. Sato, M. Taguchi, Y. Einaga, T. Murakami, A. Fujishima, "Self-Cleaning Particle Coating with Antireflection Properties", Chem. Mater. 17 (2005) 696-700.
Xie et al., "Encoding Localized Strain History Through Wrinkle Based Structural Colors", Advanced Materials 2010, 22: 1390-4394.
Xu et al., "Deformable, Programmable, and Shape-Memorizing Micro-Optics", Advanced Functional Materials 2013, 23: 3299-3306.
Xue et al., "Synthesis and characterization of elastic star shape-memory polymers as self-expandable drug-eluting stents", Journal of Materials Chemistry 2012, 22: 7403-7411.
Y. Masuda, M. Itoh, T. Yonezawa, K. Koumoto, "Low-Dimensional Arrangement of SiO2 Particles", Langmuir 18 (2002) 4155-4159.
Y. Zhao, J.S. Wang, G.Z. Mao, "Colloidal subwavelength nanostructures for antireflection optical coatings", Opt. Lett. 30 (2005) 1885-1887.
Yakacki et al., "Shape-Memory Polymers for Biomedical Applications", Adv. Polym. Sci. 2010, 226: 147-175.
Yakacki et al., "Unconstrained recovery characterization of shape-memory polymer networks for cardiovascular applications", ScienceDirect, Biomaterials 2007, 28: 2255-2263.
Yakacki, Christopher M., et al. "Impact of shape-memory programming on mechanically-driven recovery in polymers." Polymer 52.21 (2011): 4947-4954.
Yang et al., "From Metastable Colloidal Crystalline Arrays to Fast Responsive Mechanochromic Photonic Gels: An Organic Gel for Deformation-Based Display Panels", Adv. Funct. Mater. 2014, 24: 3197-3205.
A. Luque, S. Hegedus, Handbook of Photovoltaic Science and Engineering. John Wiley & Sons, West Sussex, 2003, 115 pages.
A. Lendlein, "Shape-Memory Polymers", Advances in Polymer Science 226, Springer, New York, NY 2010, 1-209.
H.A. Macleod, Thin-Film Optical Filters. Third ed., Institute of Physics Publishing, Bristol, 2001, 666 pages.
Gregg, S. J.; et al. Adsorption, Surface Area and Porosity. 2nd ed.; Academic Press Inc.: London, 1982.
Lishchuk, P; et al. "Photoacoustic characterization of nanowire arrays formed by metal-assisted chemical etching of crystalline silicon subsliales with different doping level" ScienceDirect 2019, 131-136.
Liu et al., "Review of progress in shape-memory polymers", J. Mater. Chem., 2007, 17: 1543-1558.
Louette, P.; et al. Poly(Dimethyl Siloxane) (Pdms) Xps Reference Core Level and Energy Loss Spectra Surf. Sci. Spectra 2006, 12, 38-43.
Lv et al., "Shape-Memory Polymer in Response to Solution", Advanced Engineering Materials 2008, 10, No. 6: 592-595.
Lv, T.; ; et al. Superhydrophobic Surface with Shape Memory Micro/Nanostructure and Its Application in Rewritable Chip for Droplet Storage. ACS Nano 2016, 10, 9379-9386.
M. Ibn-Elhaj, M. Schadt, "Optical polymer thin films with isotropic and anisotropic nano-corrugated surface topologies", Nature 410 (2001) 796-799.
M. Kursawe, R. Anselmann, V. Hilarius, G. Pfaff, "Nano-Particles by Wet Chemical Processing in Commercial Applicaitons", J. Sol-Gel Sci. Technol. 33 (2005) 71-74.
M. Sakhuja, J. Son, L.K. Verma, H. Yang, C.S. Bhatia, A.J. Danner, "Omnidirectional study of nanostructured glass packaging for solar modules", Prog. Photovol. 22 (2014) 356-361.
M.F. Schubert, F.W. Mont, S. Chhajed, D.J. Poxson, J.K. Kim, E.F. Schubert, "Design of multilayer antireflection coatings made from co-sputtered and low-refractive-index materials by genetic algorithm", Opt. Exp. 16 (2008) 5290-5298.
M.G. Moharam, D.A. Pommet, E.B. Grann, T.K. Gaylord, "Stable implementation of the rigorous coupled-wave analysis for surface-relief gratings: enhanced transmittance matrix approach", J. Opt. Soc. Am. A 12 (1995) 1077-1086.
M.I. Dafinone, G. Feng, T. Brugarolas, K.E. Tettey, D. Lee, "Mechanical Reinforcement of Nanoparticle Thin Films Using Atomic Layer Deposition", ACS Nano 5 (2011) 5078-5087.
M.S. Park, J.K. Kim, "Porous Structures of Polymer Films Prepared by Spin Coating with Mixed Solvents under Humid Condition", Langmuir 22 (2006) 4594-4598.
Maitland et al., "Photothermal Properties of Shape Memory Polymer Micro-Actuators for Treating Stroke", Lasers in Surgery and Medicine (2002) 30:1-11.
Mao, D.; et al. Design of Nano-Opto-Mechanical Reconfigurable Photonic Integrated Circuit. J. Lightwave Technol. 2013, 31, 1660-1669.

(56) References Cited

OTHER PUBLICATIONS

Mason et al., "Correlation between bulk morphology and luminescence in porous silicon investigated by pore collapse resulting from drying", Thin Solid Films 2002, 406: 151-158.
Mata, A.; et al. Characterization of Polydimethylsiloxane (Pdms) Properties for Biomedical Micro/Nanosystems. Biomed. Microdevices 2005, 7, 281-293.
Mather et al., "Shape Memory Polymer Research", Annu. Rev. Mater. Res. 2009. 39: 445-471.
Yoon, B.; et al, Recent Functional Material Based Approaches to Prevent and Detect Counterfeiting. J. Mater. Chem. C 2013, 1, 2388-2403.
McDonald, J. C.; et al. Poly(Dimethylsiloxane) as a Material for Fabricating Microfluidic Devices. Acc. Chem. Res. 2002, 35, 491-499.
Meng et al., "A Brief Review of Stimulus-active Polymers Responsive to Thermal, Light, Magnetic, Electric, and Water/Solvent Stimuli", Journal of Intelligent Material Systems and Structures, vol. 21—Jun. 2010: 859-885.
Meng et al., "Various shape memory effects of stimuli-responsive shape memory polymers", Smart Materials and Structures 2013, 22: 1-23.
Meng, Y.; et al. Patterned and Iridescent Plastics with 3d Inverse Opal Structure for Anticounterfeiting of the Banknotes. Adv. Opt. Mater. 2018, 6, 1701351.
Meng, Z. P.; et al. Structurally Colored Polymer Films with Narrow Stop Band, High Angle-Dependence and Good Mechanical Robustness for Trademark Anti-Counterfeiting. Nanoscale 2018, 10, 14755-14762.
Metwalli, E., et al. "Surface characterizations of mono-, di-, and tri-aminosilane treated glass substrates." Journal of colloid and interface science 298.2 (2006): 825-831.
Metzger et al., "Mechanical Properties of Mechanical Actuator for Treating Ischemic Stroke", Biomedical Microdevices 2002, 4:2: 89-96.
Milleding, Percy, et al. "Surface energy of non-corroded and corroded dental ceramic materials before and after contact with salivary proteins." European journal of oral sciences 107.5 (1999): 384-392.
Mittleman, D. M.; et al. Optical Properties of Planar Colloidal Crystals: Dynamical Diffraction and the Scalar Wave Approximation. J. Chem. Phys. 1999, 111, 345-354.
Miyazaki, Takashi, et al. "Current status of zirconia restoration." Journal of prosthodontic research 57.4 (2013): 236-261.
Mohr, Gerhard J., Daniel Citterio, and Ursula E. Spichiger-Keller. "Development of chromogenic reactands for optical sensing of alcohols." Sensors and Actuators B: Chemical 49.3 (1998): 226-234.
Moirangthem, M.; et al. An Optical Sensor Based on a Photonic Polymer Film to Detect Calcium in Serum. Adv. Funct. Mater. 2016, 26, 1154-1160.
Moirangthem, M.; et al. Photonic Shape Memory Polymer with Stable Multiple Colors. ACS Appl. Mater. Interface 2017, 9, 32161-32167.
Munakata, et al., Three-dimensionally ordered macroporous polyimide composite membrane with controlled pore size for direct methanol fuel cells, Journal of Power Sources 2008, 178(2): 596-602.
Nam, H.; et al. Inkjet Printing Based Mono-Layered Photonic Crystal Patterning for Anti-Counterfeiting Structural Colors. Sci. Rep. 2016, 6, 30885.
Nguyen et al., "Modeling the Relaxation Mechanisms of Amorphous Shape Memory Polymers", M. L. Chambers, Adv. Mater. 2010, 22: 3411-3423.
Ogawa, Yudai, et al. "Organic transdermal iontophoresis patch with built-in biofuel cell." Advanced healthcare materials 4.4 (2015): 506-510.
Pan et al., "Response of inverse-opal hydrogels to alcohols", Journal of Materials Chemistry 2012, 22: 2018-2025.
Park, H. G.; et al. Electrically Driven Single-Cell Photonic Crystal Laser. Science 2004, 305, 1444-1447.
Park, Wounjhang; et al. "Mechanically tunable photonic crystal structure." Applied Physics Letters 85.21 (2004): 4845-4847.
Peng, C. Y.; et al. Flexible Photonic Crystal Material for Multiple Anticounterfeiting Applications. ACS Appl. Mater. Interfaces 2018, 10, 9858-9864.
Pfeiffer, Kristin, et al. "Antireflection coatings for strongly curved glass lenses by atomic layer deposition." Coatings 7.8 (2017): 118.
Pham, H. H.; et al. Multidye Nanostructured Material for Optical Data Storage and Security Data Encryption. Adv. Mter. 2004, 16, 516-520.
Phillips; et al "Biomimetic broadband antireflection gratings on solar-grade multicrystalline silicon wafers" Applied Physics Letters; Nov. 9, 2011, vol. 99, pp. 191103 (1)-(3).
Pinto, Marcelo M., et al. "Influence of pH on slow crack growth of dental porcelains." dental materials 24.6 (2008): 814-823.
Potyrailo et al., "Morpho butterfly wing scales demonstrate highly selective vapour response", Nature photonics 2007, 1: 123-128.
Preis, Verena, et al. "Wear performance of dental ceramics after grinding and polishing treatments." Journal of the mechanical behavior of biomedical materials 10 (2012): 13-22.
Quitmann et al., "Environmental Memory of Polymer Networks under Stress", Adv. Mater. 2014, 26: 3441-3444.
Raigrodski, Ariel J.; et al. "The safety and efficacy of anterior ceramic fixed partial dentures: a review of the literature." The journal of prosthetic dentistry 86.5 (2001): 520-525.
Rosenstiel, S. F., et al. "Strength of a dental glass-ceramic after surface coating." Dental Materials 9.4 (1993): 274-279.
S. Degand, G. Lamblin, C.C. Dupont-Gillain, "Colloidal lithography using silica particles: Improved particle distribution and tunable wetting properties", J. Colloid Interf. Sci. 392 (2013) 219-225.
S. Lu,; et al. "Receptor-Ligand-Based Specific Cell Adhesion on Solid Surfaces: Hippocampal Neuronal Cells on Bilinker Functionalized Glass" Nano Lett. 6 (2006) 1977-1981.

\* cited by examiner

SUBSTRATES HAVING A BROADBAND ANTIREFLECTION LAYER AND METHODS OF FORMING A BROADBAND ANTIREFLECTION LAYER

CROSS-REFERENCE TO RELATED APPLICATIONS

This application is the 35 U.S.C. § 371 national stage of PCT application having serial number PCT/US2018/066234, filed on Dec. 18, 2018. This application also claims the benefit of and priority to U.S. Provisional Application Ser. No. 62/608,858, having the title "SUBSTRATES HAVING A BROADBAND ANTIREFLECTION LAYER AND METHODS OF FORMING A BROADBAND ANTIREFLECTION LAYER", filed on Dec. 21, 2018, the disclosure of which is incorporated herein by reference in its entirety.

FEDERAL SPONSORSHIP

This invention was made with government support under HDTRA1-15-1-022 awarded by the Department of Defense/Defense Threat Reduction Agency; and under CMMI1562861 awarded by the National Science Foundation. The government has certain rights in the invention.

BACKGROUND

Antireflective layers or substrates can be useful in many technologies such as solar cell and diodes. However, currently technologies for making antireflective layers can be cumbersome and costly. Also, the antireflective layers may not be suitable for the environments that some technologies have to operate in. Thus there is a need to overcome these and other deficiencies and hurdles.

SUMMARY

Embodiments of the present disclosure provide structures and substrates including broadband antireflective layers, methods of making broadband antireflective layers and the like.

An embodiment of the present disclosure includes methods of forming broadband antireflective layers on a substrate, including: providing the substrate, wherein a polyimide substrate is disposed over a first area of the substrate, and wherein a second area of the substrate does not include the polyimide substrate; etching the substrate having the polyimide substrate; and forming the broadband antireflective layer on the second area of the substrate.

An embodiment of the present disclosure also includes structures made using the methods described herein.

An embodiment of the present disclosure also includes structures including a substrate having a broadband antireflective layer that can have a total specular reflection of less than 10% at a wavelength of about 400 to about 800 nm. The broadband antireflective layer can have a plurality of pillars that are not uniformly spaced apart from one another. The broadband antireflective layer can have a height of about 500 nm to about 1000 nm, and the plurality of pillars can be spaced about 10 nm to 300 nm between a pair of pillars as measured from pillar base to pillar base. A pillar can have a diameter at the base of about 50 to 300 nm.

An embodiment of the present disclosure also includes structures including a base substrate including a polyimide substrate disposed over a first area of the base substrate and second area having a broadband antireflective layer that can have a total specular reflection of less than 10% at a wavelength of about 400 to about 800 nm. The broadband antireflective layer can have a plurality of pillars that are not uniformly spaced apart from one another. The broadband antireflective layer can have a height of about 500 nm to about 1000 nm, and the plurality of pillars can be spaced about 10 nm to 300 nm between a pair of pillars as measured from pillar base to pillar base. A pillar can have a diameter at the base of about 50 to 300 nm.

Other compositions, apparatus, methods, features, and advantages will be or become apparent to one with skill in the art upon examination of the following drawings and detailed description. It is intended that all such additional compositions, apparatus, methods, features and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

Figure 1B:
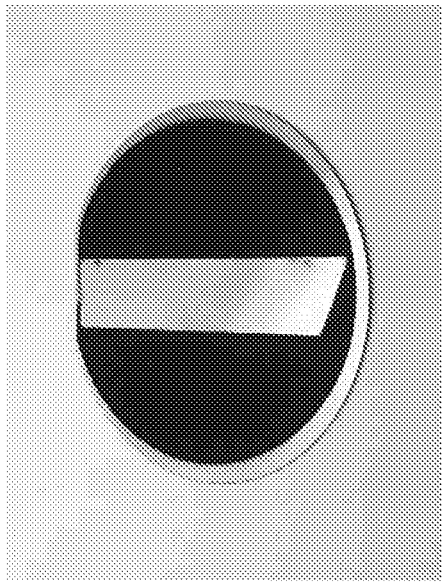
FIGS. 1A-1D are example photographs of (1A) Black silicon (BSi) wafer with the tape on the surface, (1B) the same wafer with the tape peeled off, (1C) BSi wafer with a "UF" pattern with the tape peeled off, (1D) comparison between the BSi (left) and moth-eye (right) coatings prepared using the same RIE process.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Embodiments of the present disclosure will employ, unless otherwise indicated, techniques of chemistry, material science, and the like, which are within the skill of the art. Such techniques are explained fully in the literature.

The following examples are put forth so as to provide those of ordinary skill in the art with a complete disclosure and description of how to perform the methods and use the structures disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, dimensions, frequency ranges, applications, or the like, as such can vary. It is also to be understood that the terminology used herein is for purposes of describing particular embodiments only, and is not intended to be limiting. It is also possible in the present disclosure that steps can be executed in different sequence, where this is logically possible. It is also possible that the embodiments of the present disclosure can be applied to additional embodiments involving measurements beyond the examples described herein, which are not intended to be limiting. It is furthermore possible that the embodiments of the present disclosure can be combined or integrated with other measurement techniques beyond the examples described herein, which are not intended to be limiting.

It should be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DISCUSSION

Embodiments of the present disclosure provide for methods of making substrates having an antireflective layer, substrates having an antireflective layer, devices including a substrate having an antireflective layer, and the like. Embodiments of the substrate are advantageous over other substrates due to the high thermal, radiation stability, and/or lifetime of the antireflective layer of the substrates. Embodiments of the substrate can be used in solar cells, thermophotovoltaic cells, organic light emitting diodes (OLEDs), and semiconductor light emitting diodes.

In an aspect, the method of forming the substrate having an antireflective layer is simple relative to other techniques and does not require a lithographic process, which can be advantageous in speed of processing and overall reduced cost. In an embodiment, the antireflective layer is formed from the substrate and involves only a single step, which enhances the mechanical and environmental stability of the substrate and antireflective coating. In an embodiment, the antireflective layer can have a total specular reflection that is much less than other substrates (e.g., a total specular reflection less than about 10%, about 5%, or less for a silicon substrate). Since the substrates have such a low total spectral reflection, devices including the substrates do not need sun-tracking mechanisms, which reduces the overall cost.

In an embodiment, the method of making the antireflective layer is easier, faster, and/or less expensive than other techniques for making similar structures. In an exemplary embodiment, the method of forming an antireflective layer on a base substrate includes disposing a polyimide substrate over a first area of the base substrate, where a second area of the base substrate does not include the polyimide substrate. Subsequently, the base substrate is etched to form the broadband antireflective layer in the second area of the base substrate, while the first area is not etched.

In an exemplary embodiment, the etching can include a reactive ion etching process (e.g., chlorine reactive ion etching process). The etching process forms the antireflective layer. The conditions (e.g., temperature, chemical reactants, chamber pressure, gas flow rate, etching power and duration, etc.) of the etching process can be adjusted to modify the physical characteristics (e.g., thickness of the antireflective layer, one or more dimensions of the pillars that form the antireflective layer, and the like) of the antireflective layer. Additional details regarding the etching process are described in the Examples.

In an aspect, the polyimide substrate can be placed in any area on the base substrate such as the middle area so that the second area can be on either side of the polyimide substrate. In an aspect, multiple polyimide substrates can be placed on the base substrate. In an embodiment, the polyimide substrate can have a width of about 0.5 inch to 1.5 inch, a length of about 1 inch to 5 inch, and a thickness of about 100 μm to 500 μm. In an aspect, the polyimide substrate can be a polyimide tape including all aromatic heterocyclic polyimides and linear polyimides (e.g., poly(4,4'-oxydiphenylene-pyromellitimide).

Although not intending to be bound by theory, the etching process can include the formation of a plurality of polyimide particles (e.g., nanoparticles (e.g., about 1 nm to 100 nm)) that form a polyimide mask (e.g., randomly formed) in the second area of the substrate (e.g., crystalline silicon substrate). The polyimide particles "mask" portions of the substrate and pillars are randomly formed to create the antireflective layer.

In an exemplary embodiment, the base substrate can include a silicon substrate, a gallium arsenide (GaAs) substrate, a gallium antimonide (GaSb) substrate, indium phosphide (InP), gallium nitride (GaN), and the like. In an embodiment, the silicon substrate can include a single crystalline silicon substrate, a multi-crystalline substrate, or an amorphous silicon substrate. In an embodiment, the substrate can have a thickness of about 2 μm to 1000 μm and the length and width can vary depending upon the desired use or application (e.g., 4 inches or more).

In an exemplary embodiment, the base substrate can be processed to form the antireflective layer. In an embodiment, the antireflective layer can be referred to as a moth-eye grating. In an embodiment, the antireflective layer has a total specular reflection of about 10% or less, about 8%, or less, about 5% or less, about 3% or less, or about 1% or less, for the entire visible wavelength at an incident angle of about 0° to 180°. The phrase "total specular reflection" means the overall specular reflection obtained from a substrate surface with reflection angle between 0 and 180 degrees. An integration sphere can be used in measuring total specular reflection.

In an aspect, the broadband antireflective layer can have a total specular reflection of less than 10% at wavelength of about 400 to 800 nm, of less than 5% at wavelength of about 450 to 800 nm, or of less than 3% at wavelength of about 500 to 750 nm, for a substrate such as silicon dioxide.

In an aspect, the dimensions (e.g., height, diameter, length) are not uniform and are random. In an exemplary embodiment, the antireflective layer has a height (or depth of the etched structure) of about 500 nm to 2000 nm or about 500 nm to 1000 nm. In an aspect, the pillar are not uniformly space apart (e.g., randomly spaced apart). In an embodiment, the pillars (some or all of the pillars) can have a spacing of about 10 nm to 300 nm between a pair of pillars as measured from the pillar base to pillar base, where the spacing can vary between multiple pairs of pillars.

In an embodiment, one or more of the pillars can have a diameter at the base of about 50 to 300 nm or about 50 to 150 nm. The pillar may have the same or different diameter along the length of the pillar. In an embodiment, the pillar tapers from the base to the top of the pillar, where the diameter of the pillar at the midpoint of the length of the pillar can be about 50 nm to 300 nm or about 50 to 150 nm.

In an embodiment, one or more of the pillars can have a length or height of about 100 to 2000 nm or about 100 nm to 1000 nm. In an embodiment, the length of the pillars can vary depending on the surface morphology of the substrate so that some pillars are much longer than others.

In an aspect, the base substrate can include an area that has the antireflective layer. In an aspect, the reflective layer has a total specular reflection of less than 10% at wavelength of about 400 to 800 nm, of less than 5% at wavelength of about 450 to 800 nm, or of less than 3% at wavelength of about 500 to 750 nm. In an aspect, the antireflective layer has a plurality of pillars that, are not uniformly spaced apart from one another. In an aspect, the antireflective layer can have a height of about 500 nm to 1000 nm. In an aspect, the plurality of pillars that can have a spacing of about 10 nm to 300 nm between a pair of pillars as measured from pillar base to pillar base, and the pillar has a diameter at the base of about 50 to 300 nm. In an embodiment, the base substrate can be: a silicon substrate, a gallium arsenide (GaAs) substrate, a gallium antimonide (GaSb) substrate, indium phosphide (InP), and gallium nitride (GaN), and in particular can be a silicon substrate.

While embodiments of the present disclosure are described in connection with the Example and the corresponding text and figures, there is no intent to limit the disclosure to the embodiments in these descriptions. On the contrary, the intent is to cover all alternatives, modifications, and equivalents included within the spirit and scope of embodiments of the present disclosure.

Example 1

Figure 1D:
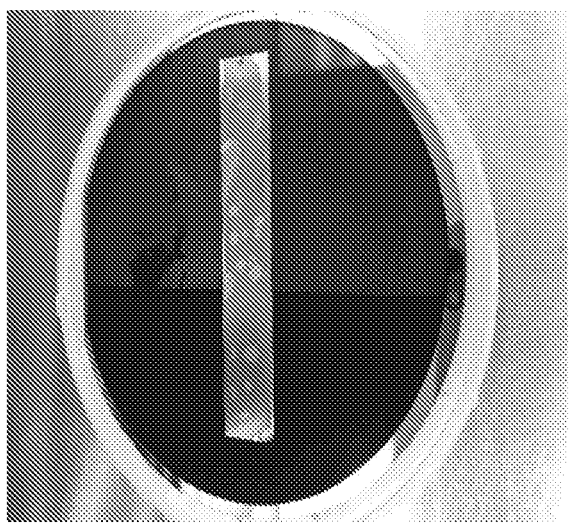
Figure 1A:
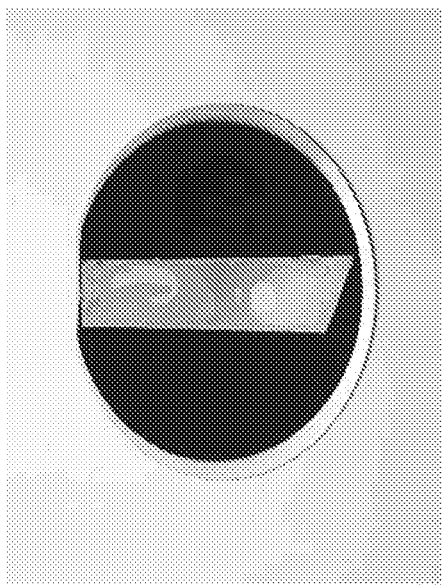
Figure 1C:
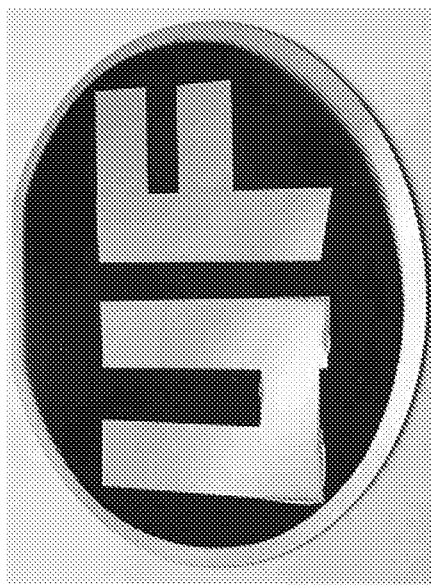

Unlike most of the existing surface texturing approaches, the methodology disclosed herein for making the black silicon (BSi) is more straightforward. Described is a self-masking etching process that does not involve any lithographic technique and is using an intact "Kapton®" polyimide tape (poly (4,4'-oxydiphenylene-pyromellitimide)). By using a chlorine reactive ion etching (RIE) recipe for a moth-eye anti-reflection coating (see Wei-Lun Min, Bin Jiang, Peng Jiang, Bioinspired Self-Cleaning Antireflection Coatings. Advanced Materials, 20, 3914-3918, 2008, herein incorporated by reference), the sample can be made with the tape simply applied on the surface of the silicon wafer prior to RIE processing. FIGS. 1A-1D show photographs of the as-prepared BSi wafers. It can be clearly seen from FIGS. 1B and 1C that the tape-covered regions are unchanged while the uncovered bare silicon (100) surface turned quite dark. As a comparison, as shown in FIG. 1D, the previously reported "moth-eye" anti-reflection coating (right half of the wafer) appears a bit grey and reflective. Notice that the defective region (uncovered wafer) on the moth-eye region also turned as dark as the BSi area.

Figure 2B:
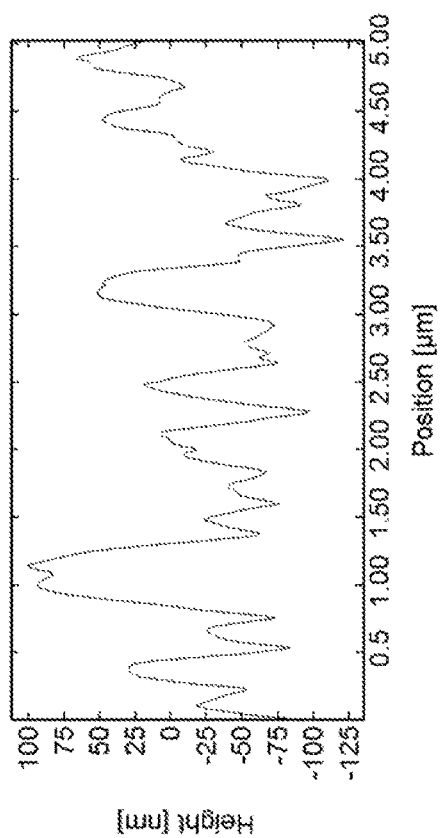
FIG. 2A provides AFM 3-D reconstruction of a 25 $\mu m^2$ area of the BSi surface, (2B) height profile along the X axis, (2C) height profile along the Y axis.
Figure 2C:
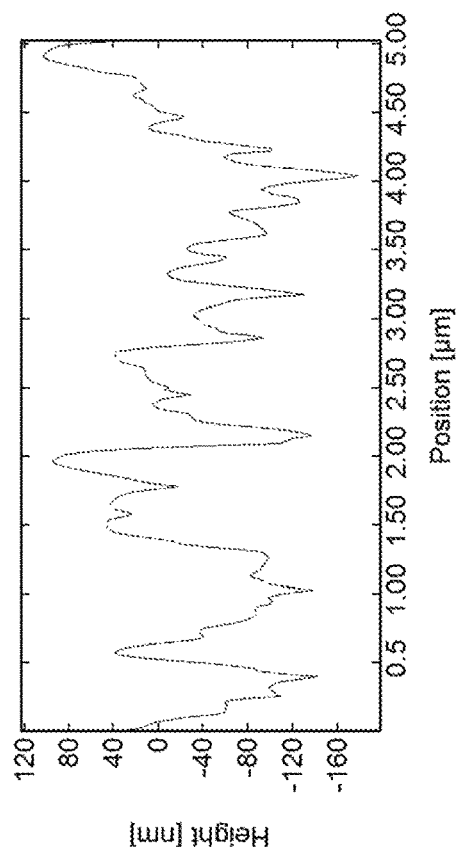
Figure 2A:
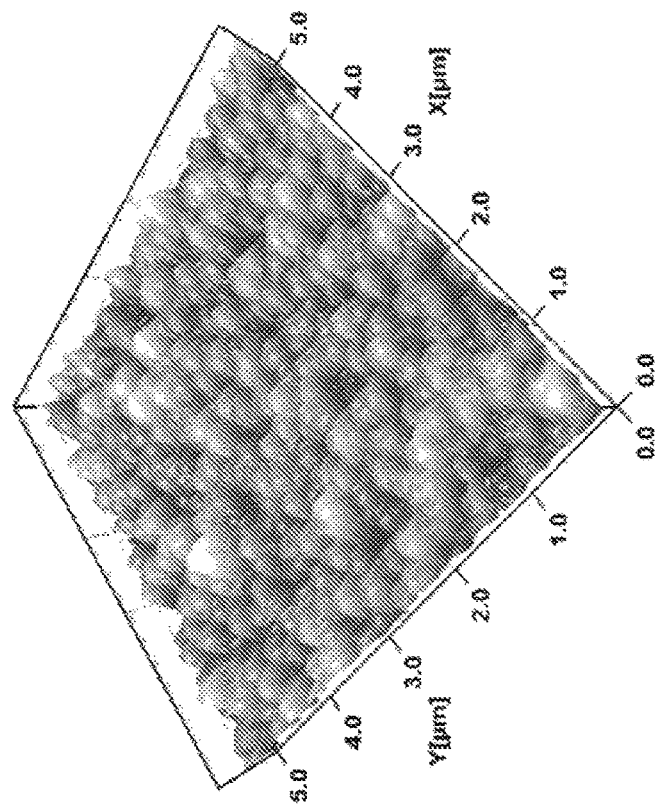

Atomic force microscopy (AFM) is a powerful tool for analysing the surface morphology. As shown is FIG. 2A, the 3-D reconstruction confirmed the presence of random, nanoscopic surface textures. The height profiles along the X and Y axis are shown in FIGS. 2B and 2C, respectively. The irregular nanopillar height and inter-pillar distances are evident, indicating there are micro-masks formed during RIE that randomly distributed on the whole wafer.

Figure 3B:
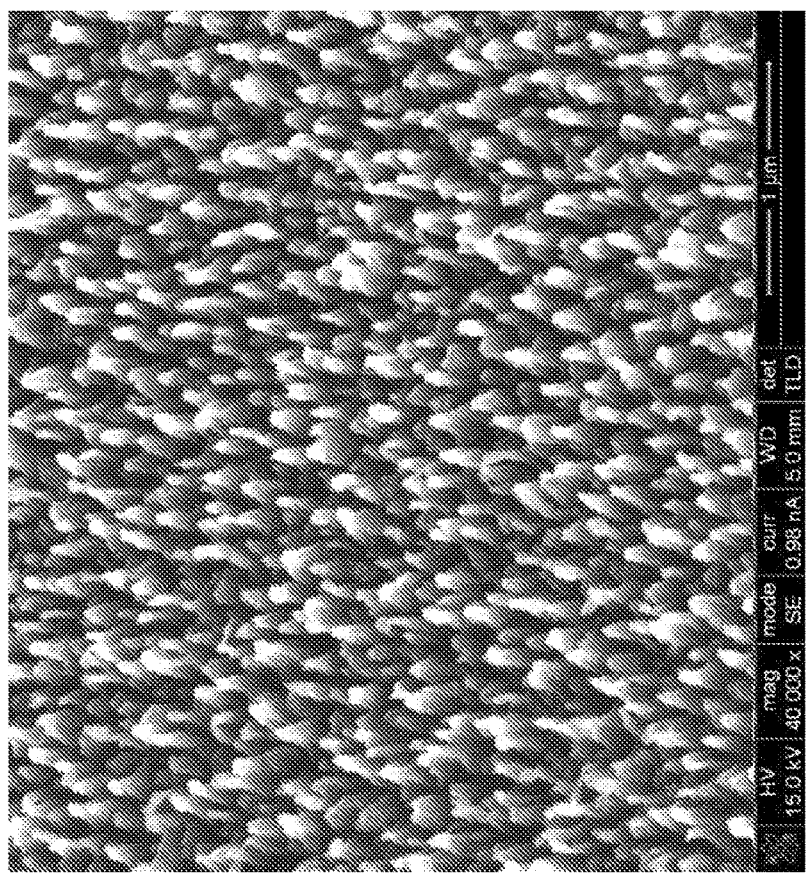
FIGS. 3A and 3B are example SEM images of (3A) the BSi surface (left) and tape-covered area (right) with a clear boundary, (3B) magnified region of the BSi surface.
Figure 3A:
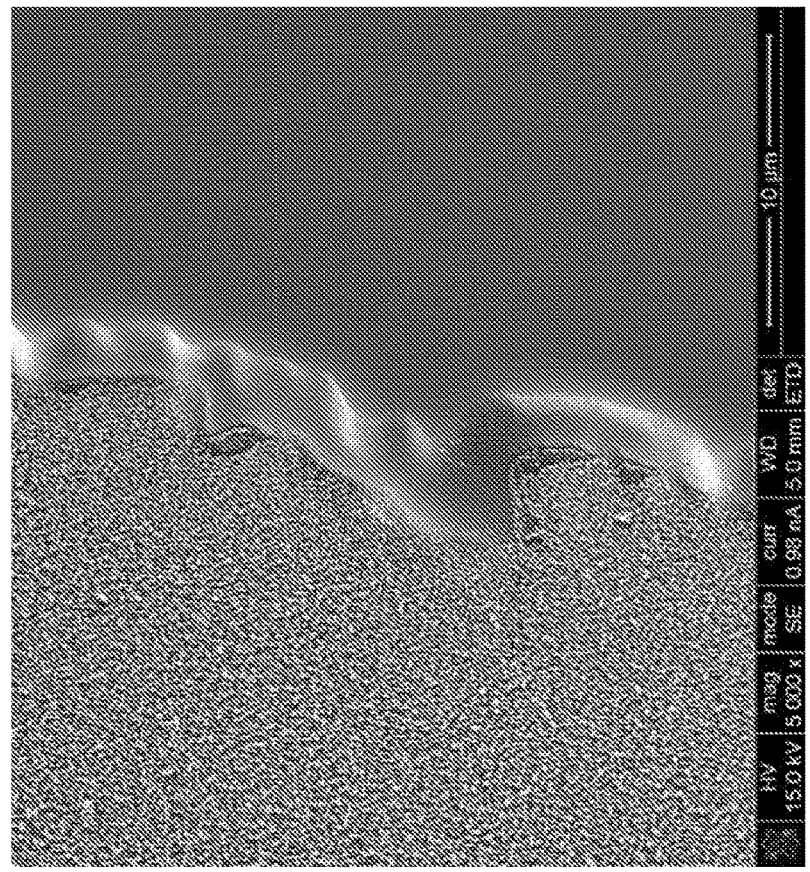

FIGS. 3A-3B show the scanning electron microscope images of the same sample. FIG. 3A shows the top view of the sample with a tilt angle of 10 degrees with an apparent boundary between the etched (left) and polyimide tape-covered (right) surfaces. It is apparent that the tape-covered surface is much smoother than the etched one. FIG. 3B shows the magnified top view of the etched surface with the same tilt angle.

Figure 4:
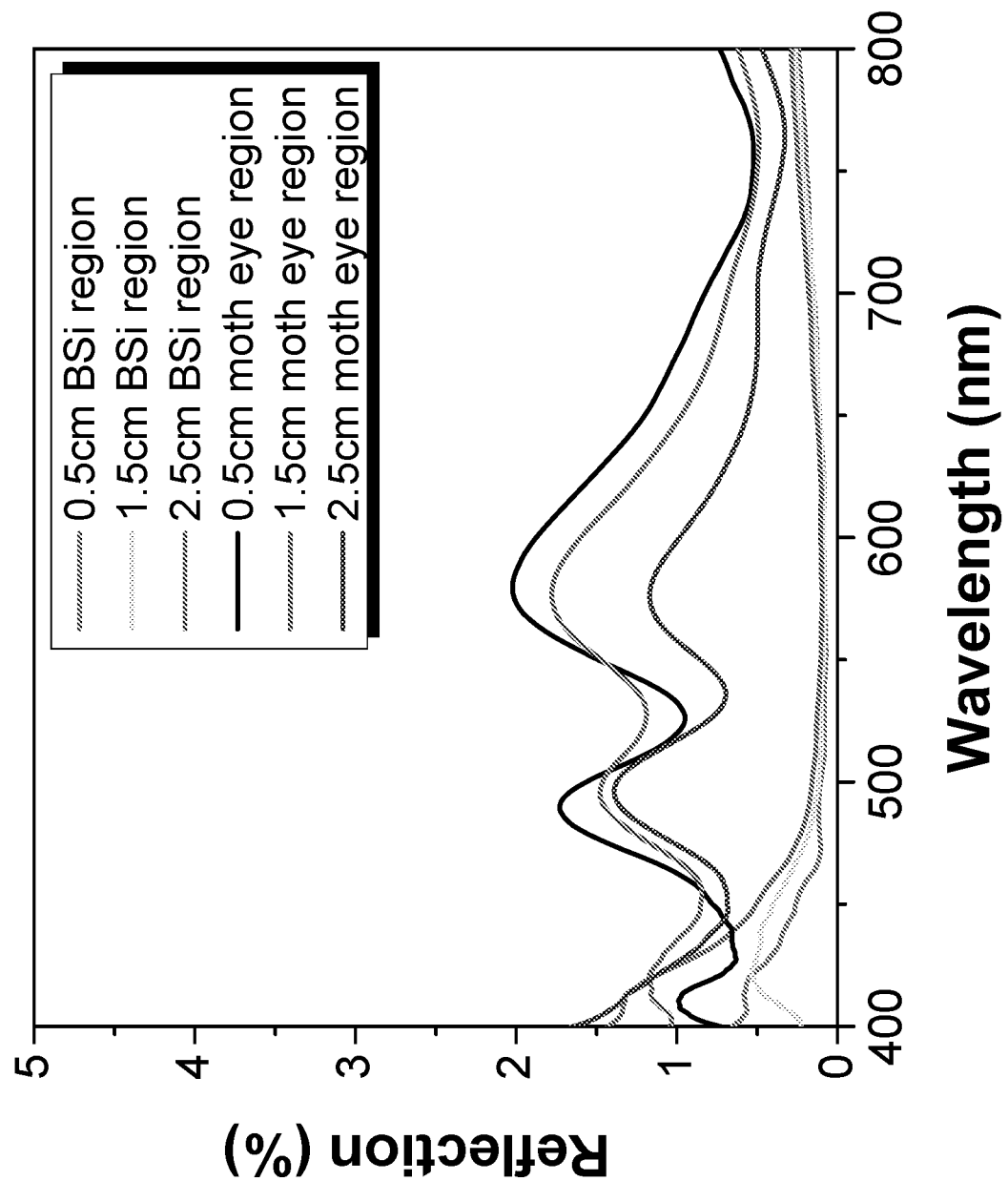
FIG. 4 provides normal-incidence optical reflection spectra obtained from different regions of the BSi half wafer and the moth-eye half wafer shown in FIG. 1D.

FIG. 4 compares the normal-incidence optical reflectance spectra obtained from the BSi region (left) and the templated moth-eye region (right) of the wafer shown in FIG. 1D. The different BSi regions (indicated by the distances from the central polyimide tape) consistently show lower reflection (three lowest lines) than those of the moth-eye regions. In addition, the BSi antireflection coatings are broadband as indicated by the low reflection over a broad range of wavelengths (from 400 to 800 nm).

Figure 5:
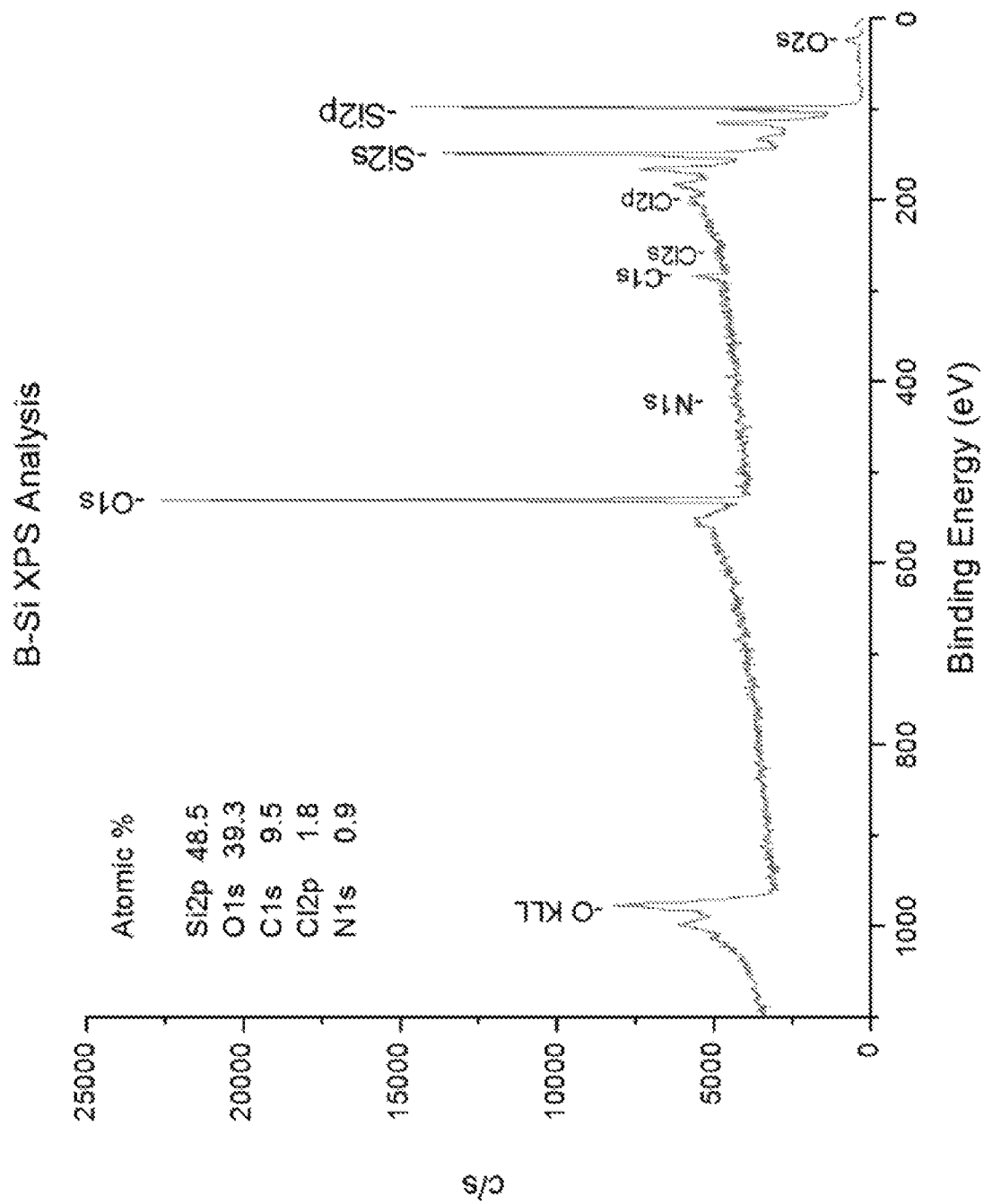
FIG. 5 shows XPS analysis of the elemental composition of the BSi surface.

FIG. 5 shows the X-ray photoelectron spectroscopy (XPS) spectrum of the BSi surface. XPS is a great tool for analysing surface elemental composition. The atomic composition, along with the AFM and SEM images, indicate that the low reflectance is due to surface texture rather than any compound being made during the fabrication process that absorbs light. One possible explanation for the dark appearance of the processed silicon wafers is the deposition of black carbon on the wafer surfaces, possibly caused by plasma-enhanced carbonization of polyimide tapes. However, this hypothesis can be excluded by the XPS analysis as only small amount of carbon 9.5 atom %) is present on the wafer surface. The sample surface is composed of mainly silicon and oxygen. The autonomous and inevitable oxidation of silicon by oxygen in air can explain the high surface concentration of oxygen atoms.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'", While only a few embodiments of the present disclosure have been shown and described herein, it will become apparent to those skilled in the art that various modifications and changes can be made in the present disclosure without departing from the spirit and scope of the present disclosure. All such modification and changes coming within the scope of the appended claims are intended to be carried out thereby.

The invention claimed is:

1. A method of forming a broadband antireflective layer on a base substrate, comprising:
providing the base substrate having a polyimide substrate disposed over a first area of the base substrate, wherein a second area of the base substrate surrounds the first area and wherein the second area does not include the polyimide substrate;
etching the second area of the base substrate, wherein the polyimide substrate forms randomly-distributed micromasks on the second area during etching; and
forming non-uniformly spaced and non-uniformly sized antireflective nanostructures on the second area of the base substrate.

2. The method of claim 1, wherein the base substrate is selected from the group consisting of: a silicon substrate, a gallium arsenide (GaAs) substrate, a gallium antimonide (GaSb) substrate, indium phosphide (InP), and gallium nitride (GaN).

3. The method of claim 1, wherein the broadband antireflective layer has a height of about 500 nm to about 1000 nm.

4. The method of claim 1, wherein the broadband antireflective layer has a plurality of pillars that have a spacing of about 10 nm to about 300 nm between a pair of pillars as measured from pillar base to pillar base, wherein the pillar height is about 100 nm to 300 nm, and at least one pillar has a diameter at the base of about 50 to 300 nm.

5. The method of claim 4, wherein the pillars are not uniformly spaced apart.

6. The method of claim 1, wherein the broadband antireflective layer has a total specular reflection of less than 10% at wavelength of about 400 to about 800 nm.

7. The method of claim 1, wherein the broadband antireflective layer has a total specular reflection of less than 5% at wavelength of about 450 to about 800 nm.

8. The method of claim 1, wherein the broadband antireflective layer has a total specular reflection of less than 3% at wavelength of about 500 to about 750 nm.

9. The method of claim 1, wherein the base substrate is a crystalline silicon.

10. The method of claim 1, wherein the etching is chlorine reactive ion etching.

\* \* \* \* \*